United States Patent
Ram et al.

(10) Patent No.: US 10,854,352 B1
(45) Date of Patent: Dec. 1, 2020

(54) CONDUCTING FILMS AND METHODS FOR FORMING THEM

(71) Applicants: Manoj Kumar Ram, Palm Harbor, FL (US); Elias K. Stefanakos, Tampa, FL (US); Dharendra Yogi Goswami, Tampa, FL (US)

(72) Inventors: Manoj Kumar Ram, Palm Harbor, FL (US); Elias K. Stefanakos, Tampa, FL (US); Dharendra Yogi Goswami, Tampa, FL (US)

(73) Assignee: UNIVERSITY OF SOUTH FLORIDA, Tampa, FL (US)

( * ) Notice: Subject to any disclaimer, the term of this patent is extended or adjusted under 35 U.S.C. 154(b) by 541 days.

(21) Appl. No.: 14/919,971

(22) Filed: Oct. 22, 2015

Related U.S. Application Data

(60) Provisional application No. 62/067,031, filed on Oct. 22, 2014.

(51) Int. Cl.
*C25D 1/00* (2006.01)
*C25D 1/20* (2006.01)
*H01B 1/12* (2006.01)
*B32B 38/10* (2006.01)

(52) U.S. Cl.
CPC ............. *H01B 1/127* (2013.01); *B32B 38/10* (2013.01); *H01B 1/128* (2013.01)

(58) Field of Classification Search
CPC ..................................... C25D 1/00; C25D 1/20
USPC .......................................................... 205/67
See application file for complete search history.

(56) References Cited

U.S. PATENT DOCUMENTS

| 4,166,012 A * | 8/1979 | Quinn ..................... C25D 5/56 205/166 |
| 5,393,365 A * | 2/1995 | Smith ............... B32B 17/10018 156/100 |
| 5,435,903 A * | 7/1995 | Oda ........................ H05K 3/244 205/258 |
| 7,014,794 B1 | 3/2006 | Olinga |
| 2005/0202238 A1 * | 9/2005 | Kishioka ................... B32B 7/12 428/355 AC |
| 2012/0306114 A1 * | 12/2012 | Greco .................... B82Y 30/00 264/104 |

OTHER PUBLICATIONS

Camalet, J-L., et al., "Electrodeposition of polyaniline on mild steel in a two step process", Synthetic Metals, 102, 1999, p. 1386-1387. (Year: 1999).*

Rozsnyai, L.F., et al., "Controlling the Adhesion of Conducting Polymer Films with Patterened Self-Assembled Monolayers", Chemistry of Materials, vol. 8, No. 2, 1996, p. 309-311. (Year: 1996).*

(Continued)

*Primary Examiner* — Edna Wong
(74) *Attorney, Agent, or Firm* — Thomas | Horstemeyer, LLP

(57) ABSTRACT

In one embodiment, a method for forming a conducting film includes depositing a base layer of a conducting polymer on a substrate, the polymer forming only a weak bond with the substrate, depositing a top layer of a conducting material on the base layer, applying adhesive tape to the top layer, and peeling the tape off of the substrate, removing the top layer along with the tape.

10 Claims, 8 Drawing Sheets

(56) References Cited

OTHER PUBLICATIONS

Wei, H., et al., "Electropolynnerized Polyaniline Stabilized Tungsten Oxide Nanocomposite Films: Electrochromic Behavior and Electrochemical Energy Storage", The Journal of Physical Chemistry C, 2012, 116, p. 25052-25064. (Year: 2012).*
Li, C., et al., "Conducting Polymer Nanomaterials: Electrosynthesis and Applications", 2009, vol. 38, No. 8, p. 2149-2496. (Year: 2009).*
Estrany, F., et al., "Electroactive properties and electrochemical stability of poly(3,4-ethylenedioxythiophene) and poly(N-methylpyrrole) multi-layered films generated by anodic oxidation", Portugaliae Electrochimica Acta, 25, 2007, p. 55-65 (Year: 2007).*
Peng et al. "A comparative study on electrochemical co-deposition and capacitance of composite films of conducting polymers and carbon nanotubes", Electrochimica Acta, 53, 2007, p. 525-537 (Year: 2007).*
Zainudeen et al. ("PEDOT and PPY conducting polymer bilayer and trilayer actuators", Sensors and Actuators B, 134, 2008, p. 467-470 (Year: 2008).*
Guo et al. ("Stretchable Polymeric Multielectrode Array for Conformal Neural Interfacing", Adv. Mater. 2014, 26, 9, 1427-1433 (Year: 2014).*
3M Masking and Specialty Products, 2016. (Year: 2016).*
Estrany et al., "Electroactive Properties and Electrochemical Stability of Poly(3,4-ethylenedioxythiophene) and Poly(N-methylpyrrole) Multi-layered Films Generated by Anodic Oxidation," Portugaliae Electrochimica Acta (2007), vol. 25, pp. 55-65. (Year: 2007).*
de Leon et al., "Conducting Polymer Coatings in Electrochemical Technology Part 2—Application Areas," Transactions of the Institute of Metal Finishing (2008), vol. 86, No. 1, pp. 34-40. (Year: 2008).*
Zainudeen et al., "Actuators Based on PEDOT and PPY Conducting Polymer Bilayers and Trilayers," Second International Conference on Industrial and Information Systems (ICIIS 2007, Aug. 8-11, 2007), Sri Lanka, pp. 461-464. (Year: 2007).*
Niu, et al., A "skeleton/skin" strategy for preparing ultrathin freestanding single-walled carbon nanotube/polyaniline films for high performance supercapacitor electrodes; Energy and Environmental Science; Sce., 2012, 5, 8726.
Zhou, et al. Efficient recyclable organic solar cells on cellulose nanocrystal substrates with a conducting polymer top electrode deposited by film-transfer lamination; Organic Electronics 15, 2014, 661-666.
Castany, et al., Liquid crystal micro-cells: collective fabrication of individual micro-cells; J. Micromech. Microeng. 20, 2010.
Park, et al., Polymer thin-film transistors fabricated by dry transfer of polymer semiconductor; AIP 86, Jun. 2014.
B. Wessling, "Dispersion as the key to processing conductive polymers," Handbook of conducting polymers, vol. 2, 1997.
L. Sun and S. C. Yang, "Solution processable conducting polymer: polyaniline-polyelectrolyte complexes," in MRS Proceedings, 1993.
J. Yue, Z. H. Wang, K. R. Cromack, A. J. Epstein, and A. G. MacDiarmid, "Effect of sulfonic acid group on polyaniline backbone," Journal of the American Chemical Society, vol. 113, pp. 2665-2671, 1991.
X.-L. Wei, Y. Wang, S. Long, C. Bobeczko, and A. Epstein, "Synthesis and physical properties of highly sulfonated polyaniline," Journal of the American Chemical Society, vol. 118, pp. 2545-2555, 1996.
M. K. Ram, N. Sarkar, H. Ding, and C. Nicolini, "Synthesis of controlled copolymerisation of aniline and ortho-anisidine: a physical insight in its Langmuir-Schaefer films," Synthetic Metals, vol. 123, pp. 197-206, 2001.
M. K. Ram, M. Adami, M. Sartore, M. Salerno, S. Paddeu, and C. Nicolini, "Comparative studies on Langmuir-Schaefer films of polyanilines," Synthetic Metals, vol. 100, pp. 249-259, 1999.

M. K. Ram, Ö. Yavuz, V. Lahsangah, and M. Aldissi, "CO gas sensing from ultrathin nano-composite conducting polymer film," Sensors and Actuators B: Chemical, vol. 106, pp. 750-757, 2005.
M. K. Ram, O. Yavuz, and M. Aldissi, "NO2 gas sensing based on ordered ultrathin films of conducting polymer and its nanocomposite," Synthetic Metals, vol. 151, pp. 77-84, 2005.
S. Misra, M. Ram, S. Pandey, B. Malhotra, and S. Chandra, "Vacuum-deposited metal/polyaniline Schottky device," Applied Physics Letters, vol. 61, pp. 1219-1221, 1992.
I. M. Arafa, H. M. El-Ghanem, and A. L. Ahmad, "Photoconductivity and photovoltaic properties of polyaniline immobilized onto metallurgical porous silicon powder," Polymer International, vol. 62, pp. 1283-1292, 2013.
H. Karami, M. F. Mousavi, and M. Shamsipur, "A new design for dry polyaniline rechargeable batteries," Journal of Power Sources, vol. 117, pp. 255-259, 2003.
H. Gómez, M. K. Ram, F. Alvi, P. Villalba, E. L. Stefanakos, and A. Kumar, "Graphene-conducting polymer nanocomposite as novel electrode for supercapacitors," Journal of Power Sources, vol. 196, pp. 4102-4108, 2011.
P. A. Basnayaka, M. K. Ram, E. K. Stefanakos, and A. Kumar, "Supercapacitors based on graphene-polyaniline derivative nanocomposite electrode materials," Electrochimica Acta, vol. 92, pp. 376-382, 2013.
H. Yan, K. Tomizawa, H. Ohno, and N. Toshima, "All-Solid Actuator Consisting of Polyaniline Film and Solid Polymer Electrolyte," Macromolecular Materials and Engineering, vol. 288, pp. 578-584, 2003.
D. E. Demirocak, S. Kuravi, M. K. Ram, C. K. Jotshi, S. Srinivasan, A. Kumar, et al., "Investigation of Polyaniline Nanocomposites and Cross-Linked Polyaniline for Hydrogen Storage," Advanced Materials Research, vol. 445, pp. 571-576, 2012.
R. J. Tseng, J. Huang, J. Ouyang, R. B. Kaner, and Y. Yang, "Polyaniline nanofiber/gold nanoparticle nonvolatile memory," Nano Letters, vol. 5, pp. 1077-1080, 2005.
M. Ram, N. Sundaresan, and B. Malhotra, "Performance of electrochromic cells of polyaniline in polymeric electrolytes," Journal of Materials Science Letters, vol. 13, pp. 1490-1493, 1994.
M. K. Ram, M. Salerno, M. Adami, P. Faraci, and C. Nicolini, "Physical properties of polyaniline films: assembled by the layer-by-layer technique," Langmuir, vol. 15, pp. 1252-1259, 1999.
N. Tanigaki, C. Heck, and T. Mizokuro, "Oriented Thin Films of Polyaniline by Friction Transfer Method," Molecular Crystals and Liquid Crystals, vol. 505, pp. 80/[318]-86/[324], 2009.
M. Ram, N. Sundaresan, and B. Malhotra, "Langmuir-Blodgett films of processable polyaniline," The Journal of Physical Chemistry, vol. 97, pp. 11580-11582, 1993.
K. Ramanathan, M. Ram, B. Malhotra, and A. S. N. Murthy, "Application of polyaniline-Langmuir-Blodgett films as a glucose biosensor," Materials Science and Engineering: C, vol. 3, pp. 159-163, 199.
N. Agbor, J. Cresswell, M. Petty, and A. Monkman, "An optical gas sensor based on polyaniline Langmuir-Blodgett films," Sensors and Actuators B: Chemical, vol. 41, pp. 137-141, 1997.
Z. Matharu, G. Sumana, S. K. Arya, S. Singh, V. Gupta, and B. Malhotra, "Polyaniline Langmuir-Blodgett film based cholesterol biosensor," Langmuir, vol. 23, pp. 13188-13192, 2007.
M. Ram, R. Mehrotra, S. Pandey, and B. Malhotra, "AC conductivity of polyemeraldine base," Journal of Physics: Condensed Matter, vol. 6, p. 8913, 1994.
W. Li and M. Wan, "Stability of polyaniline synthesized by a doping-dedoping-redoping method," Journal of Applied Polymer Science, vol. 71, pp. 615-621, 1999.
K. Lee, A. Heeger, and Y. Cao, "Reflectance spectra of polyaniline," Synthetic Metals, vol. 72, pp. 25-34, 1995.
S. H. Domingues, R. V. Salvatierra, M. M. Oliveira, and A. J. Zarbin, "Transparent and conductive thin films of graphene/polyaniline nanocomposites prepared through interfacial polymerization," Chemical Communications, vol. 47, pp. 2592-2594, 2011.
C. Meng, C. Liu, and S. Fan, "Flexible carbon nanotube/polyaniline paper-like films and their enhanced electrochemical properties," Electrochemistry Communications, vol. 11, pp. 186-189, 2009.

(56) References Cited

OTHER PUBLICATIONS

T. Olinga, A. Pron, and J.-P. Travers, "Use of sulphonic and phosphonic acids as dopants of conductive polyaniline films and conductive composite material based on polyaniline," ed: Google Patents, 2006.

P. A. Basnayaka, "Development of Nanostructured Graphene/ Conducting Polymer Composite Materials for Supercapacitor Applications," 2013.

* cited by examiner

CONDUCTING FILMS AND METHODS FOR FORMING THEM

CROSS-REFERENCE TO RELATED APPLICATION

This application claims the benefit of U.S. Provisional Application Ser. No. 62/067,031, filed Oct. 22, 2014, which is hereby incorporated by reference herein in its entirety.

BACKGROUND

Conducting polymers have potential uses in a variety of commercial applications, including sensors, biosensors, electronics, photovoltaics, batteries, light-emitting diodes, electrostatic discharge materials, electromagnetic shielding, and supercapacitors. An obstacle to the utilization of conducting polymers in such applications is the absence of an integrated material science approach to fabricating flexible polymer films for those applications.

Achieving long-term stability of the conducting polymer film is a challenge. In addition, many conducting polymers are not soluble in organic solvents, which can pose a problem in the fabrication of flexible films. Furthermore, if the monomer or polymer is functionalized to obtain a processable film, the conductivity as well as its electrochemical and optical properties may be compromised.

Electrochemical synthesis is currently the best approach for forming highly conducting films. Even using this approach, it is still difficult to form flexible conducting polymer films on various substrates and, even if such films are successfully formed, it is difficult to transfer the films to other substrates.

From the foregoing discussion, it can be appreciated that it would be desirable to have alternative methods for forming conductive polymer films that avoid the drawbacks of current methods.

BRIEF DESCRIPTION OF THE DRAWINGS

The present disclosure may be better understood with reference to the following figures. Matching reference numerals designate corresponding parts throughout the figures, which are not necessarily drawn to scale.

DETAILED DESCRIPTION

As described above, it would be desirable to have alternative methods for forming conductive polymer films that avoid the drawbacks of current methods. Disclosed herein are examples of such methods and the films that result from practicing the methods. In some embodiments, a first or base layer of a first conducting polymer is deposited on a substrate that forms only a weak bond with the substrate. Once the base layer has been formed, a second or top layer of a second conducting polymer is deposited on top of the base layer. By way of example, both layers can be deposited electrochemically. Because the base layer forms only a weak bond with the substrate, the base layer facilitates removal of the top layer from the substrate. In some embodiments, the top layer can be removed by applying adhesive tape to the top layer and then peeling the tape away from the substrate along with the top layer.

In the following disclosure, various specific embodiments are described. It is to be understood that those embodiments are example implementations of the disclosed inventions and that alternative embodiments are possible. All such embodiments are intended to fall within the scope of this disclosure.

The methods disclosed herein enable the transfer of conducting polymer films, including conducting polymer nanocomposite films, to substrates other than the substrate on which the films have been deposited. It has been determined that, when a film of a conducting polymer that forms only weak bonds with the substrate on which it is deposited is formed as a base layer, it facilitates the removal of a layer of another conducting polymer that is deposited on top of the base layer. Because of the weak bond formed between the base layer and the substrate, the top layer can be removed from the substrate by simply applying adhesive tape to the top layer and then peeling the tape, along with the top layer, from the substrate.

Figure 1:
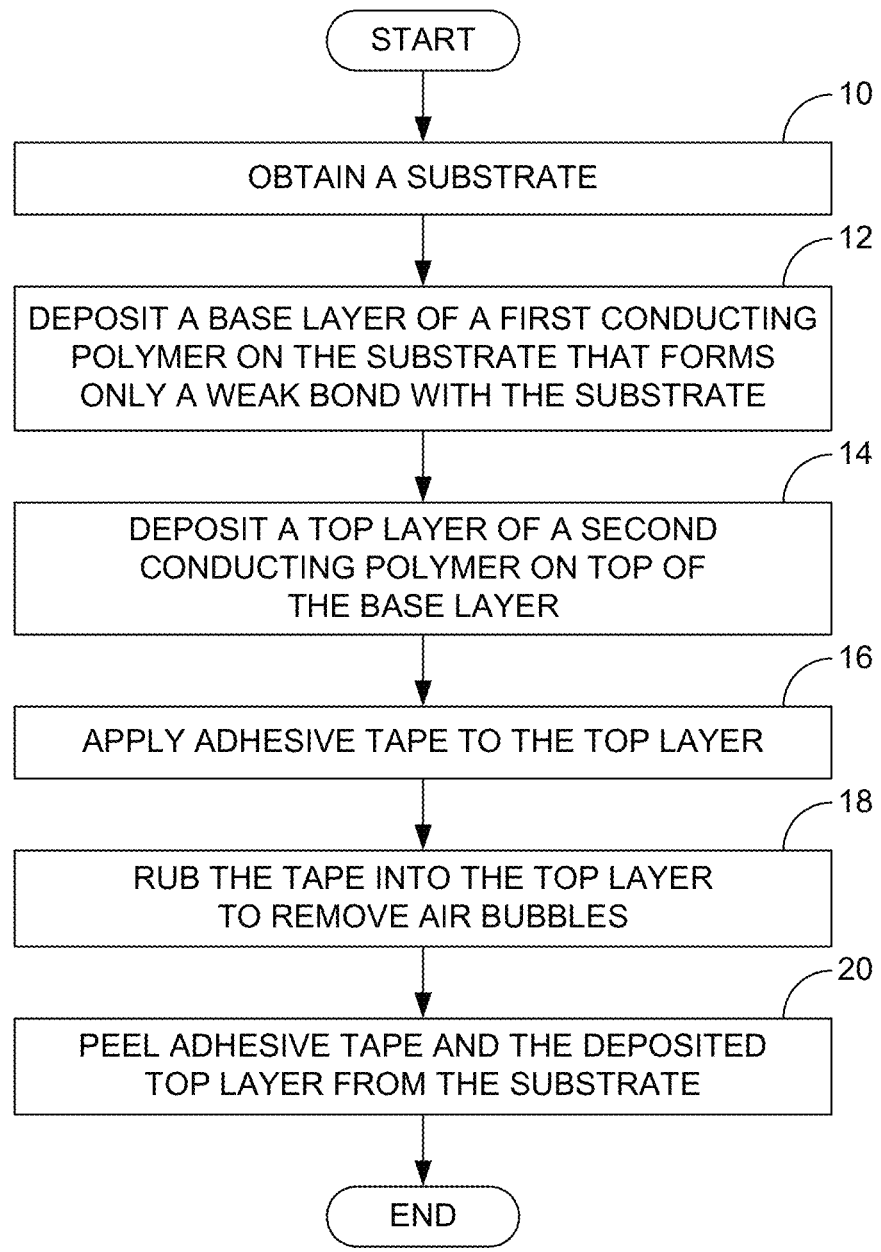
FIG. 1 is a flow diagram of an embodiment of a method for forming a conducting film.
Figure 2C:
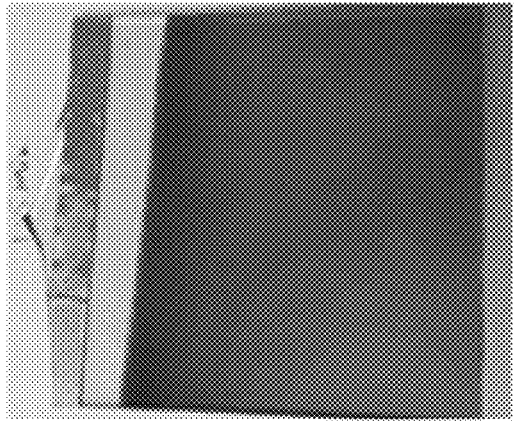
FIGS. 2A-2E are photographs of thin polypyrrole PPy films electrochemically deposited on an indium tin oxide (ITO) coated glass plate at constant current for 15 sec, 30 sec, 1.5 min, 2 min, and 2.5 min, respectively.
Figure 2B:
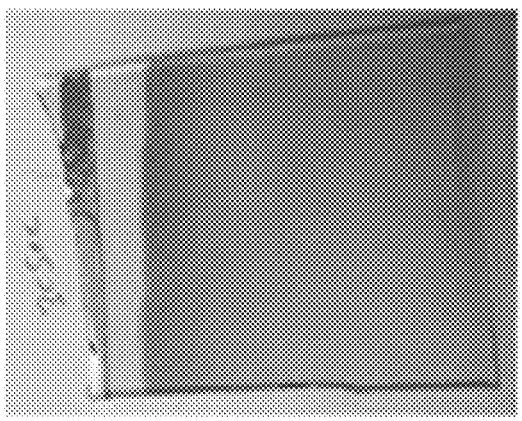
Figure 2A:
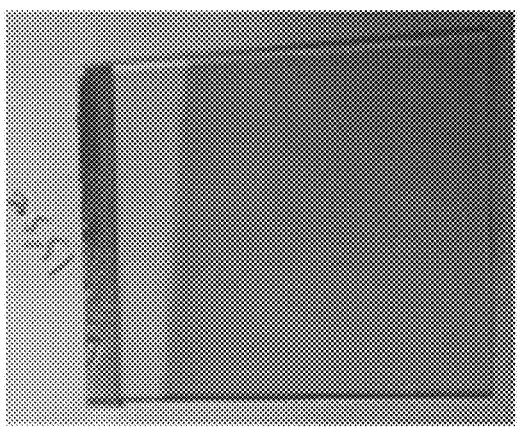
Figure 2E:
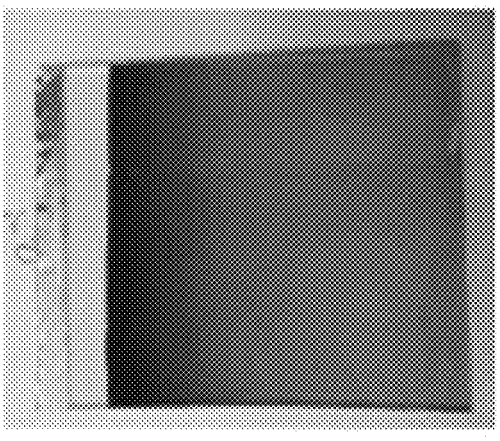
Figure 2D:
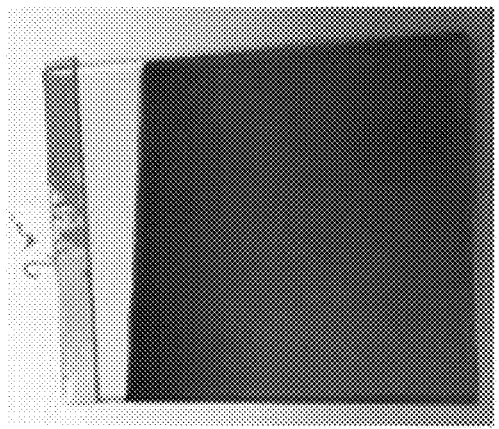

FIG. 1 is a flow chart that illustrates an example of the above-described process. Beginning with block 10, a substrate is obtained. In some embodiments, the substrate can be a conductive substrate. Examples of conductive substrates include metal substrates, such as steel, aluminum, or copper substrates, and non-conductive substrates that are coated with a conductive material, such as glass substrates or polymer substrates (e.g., polyethylene terephthalate (PET) substrates) coated with indium tin oxide (ITO).

Irrespective of the nature of the substrate, a thin first or base layer of a first conducting polymer that forms only a weak bond with the substrate is deposited on the substrate, as indicated in block 12. Because of this weak bonding, the base layer can act as a release layer that enables the removal of a further conducting polymer layer described below. In some embodiments, the conducting polymer of the base layer is polypyrrole (PPy) that is electrochemically deposited on the substrate. By way of example, the base layer can be approximately 1 to 100 nm thick.

Next, with reference to block 14, a second or top layer of a second conducting polymer is deposited on top of the base layer. The second conducting polymer can be substantially any conducting polymer other than the first conducting polymer. The second conducting polymer can be a pure polymer or copolymer, or a nanocomposite polymer that includes nanoparticles of other (non-polymer) materials. Example second conducting polymers include polyaniline (PANI), polythiophene (PTh), polyethylenedioxythiophene (PEDOT), polyhexylthiophene (PHTh), conducting methyl substituted polyaniline, ethyl substituted polyaniline, methoxy substituted polyaniline, conducting polymer copolymer (poly(aniline-pyrrole)), and conducting polymer nanocomposites containing one or more of graphene (G), carbon (C) nanotubes, tin oxide (e.g., $SnO_2$), iron oxide ($Fe_2O_3$), titanium oxide ($TiO_2$), tungsten oxide ($WO_3$), and nanodiamond. In some embodiments, the second conducting polymer of the top layer is electrochemically deposited on the substrate and is approximately 2 to 2000 nm thick. Notably, although a single top layer has been described as being formed, the top layer can, in some embodiments, include multiple sublayers of like or unlike materials that together form the top layer.

Once the top layer has been formed, pressure-sensitive adhesive tape can be applied to the top layer, as indicated in block 16. In some embodiments, the adhesive tape can comprise conventional transparent polymer tape, such as Scotch™ brand tape. Once applied, the tape can be rubbed into the top layer to remove any air bubbles that may exist, as indicated in block 18. In some embodiments, this step can be performed while maintaining the substrate in a vacuum. Next, as indicated in block 20, the tape can be peeled from the substrate, along with the top layer, which is adhered to the tape. Notably, part or all of the base layer may be removed along with the top layer depending upon how strongly the base layer is bonded to the substrate as opposed to the top layer. Accordingly, there may be residual base layer material (e.g., PPy) on the top layer. At this point, a flexible layer of conducting polymer is obtained that, for example, can be applied in any one of a variety of commercial applications, such as molecular electronics, sensors, biosensors, batteries, supercapacitors, antistatic dissipation of charges, electromagnetic shielding, actuator, printed circuit board, electrochromic, touchchromic, photovoltaic, dye synthesized solar cell, and the like.

Although the top layer has been described as comprising a conducting polymer, it is noted that other materials can be deposited on the base layer, if desired. For example, top layers of copper, silver, tin, gold, or other metals can be deposited over a PPy thin film, which would facilitate separation of the top metal layer from the substrate. It is also noted that, after the top layer has been removed from the substrate with the tape, the tape can be dissolved with an appropriate solvent that does not affect the top layer, such as acetone or chloroform. In such a case, a free film of conducting material can be obtained.

Figure 3:
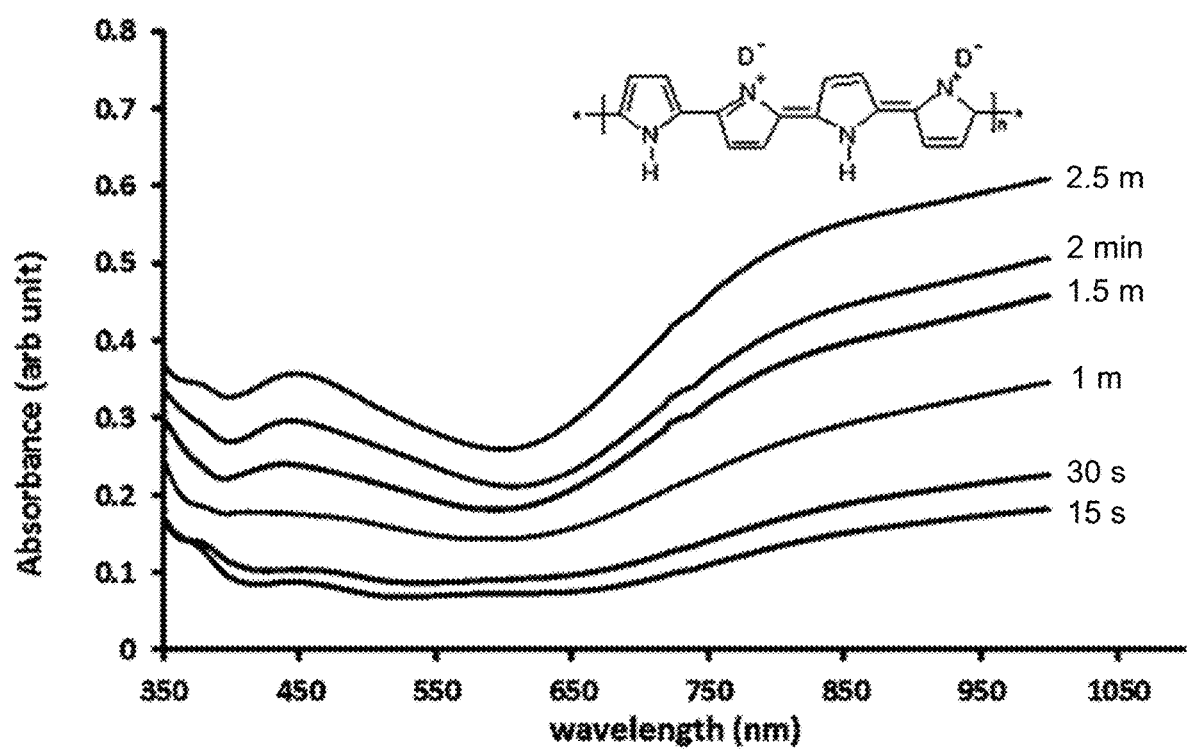
FIG. 3 is a graph that shows the UV-visible (UV-vis) spectrum of electrochemically deposited films on ITO-coated glass plates as a function of time (inset shows the polaron structure of the PPy film).

Experiments were performed to evaluate the above-described film fabrication method. FIGS. 2A-2E show photographs of PPy films that were deposited on an ITO-coated glass plate for 15 seconds, 30 seconds, 1.5 minutes, 2 minutes, and 2.5 minutes, respectively. As is apparent from these photographs, the film is thicker and darker the longer material is deposited. FIG. 3 shows the ultra violet-visible (UV-vis) spectra of the PPy films on the ITO-coated glass plate. The film was deposited using a solution of monomer pyrrole of 0.2 M and 0.2 M p-toluenesulfonic acid (PTSA) at a current density of 0.1 $mA/cm^2$. The characteristic PPy peaks are clearly distinguishable at 380, 450, and 818 nm. There is a gradual increase in the UV-vis absorption as a function of the deposition time, indicating a continuous electrochemical faradaic process in the deposition of the PPy film. The UV-vis spectrum shows an increase in the film thickness of the PPy film as a function of time. It was observed that approximately 30 seconds to one minute of film deposition was sufficient to enable the removal of the electrochemically deposited PPy film from the ITO-coated glass plate. The PPy film deposited for 2.5 minutes could be removed with no difficulty.

Figure 4A:
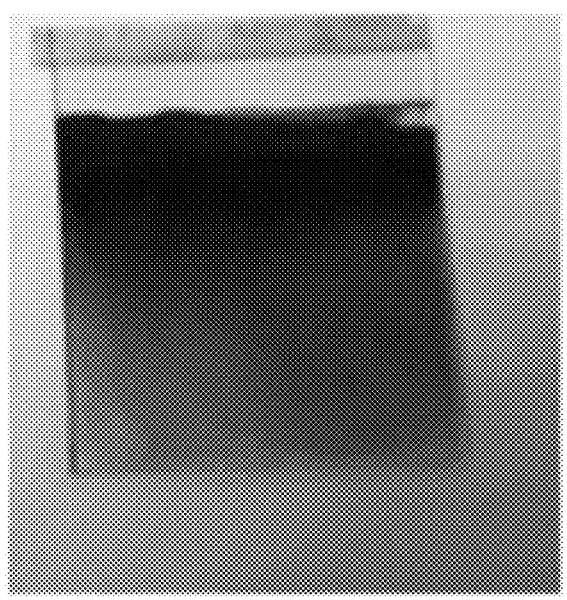
FIGS. 4A and 4B are photographs of thin and thick films, respectively, deposited on a PPy film over an ITO-coated glass plate.
Figure 4B:
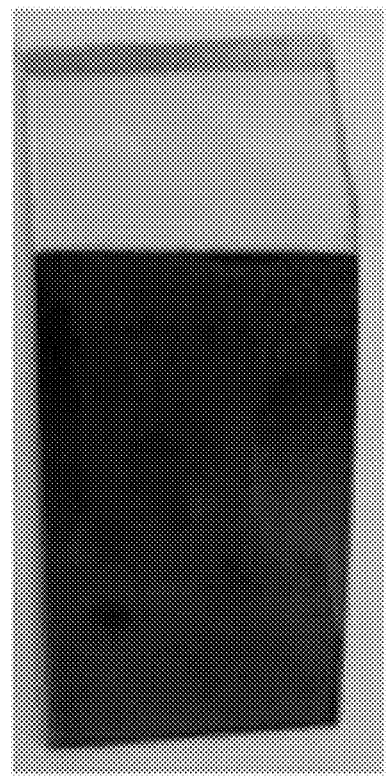
Figure 5:
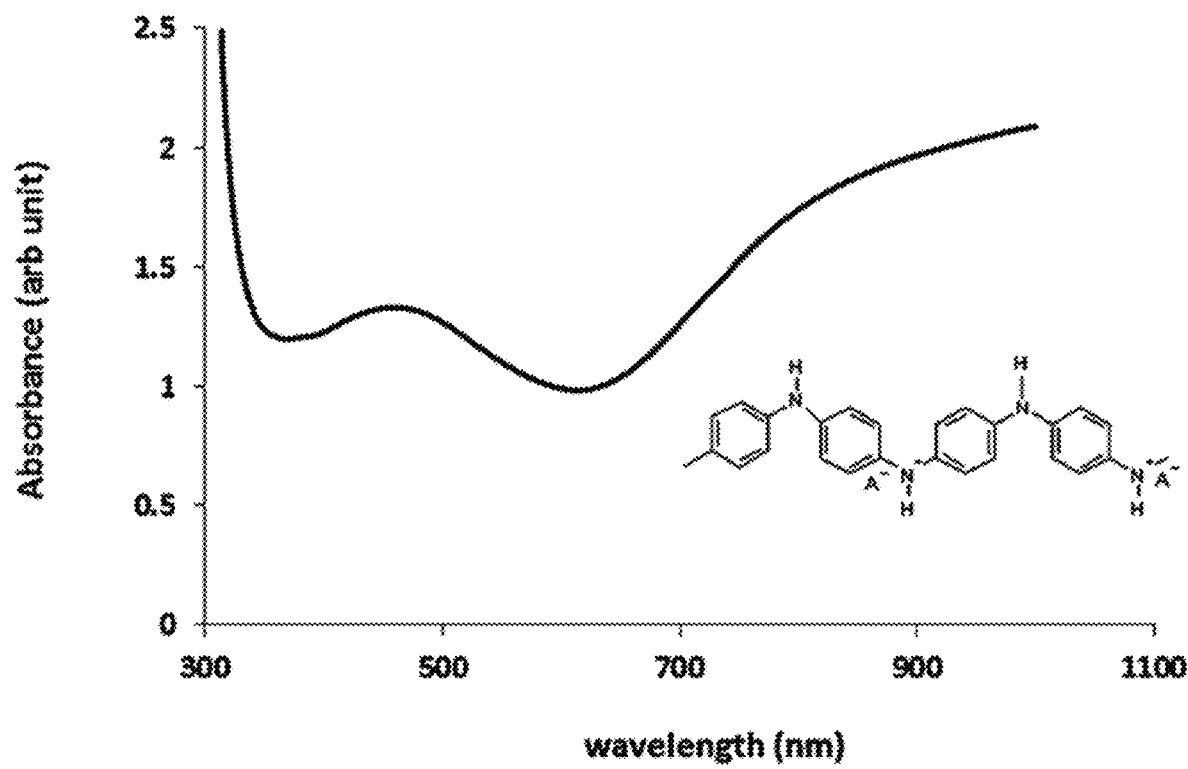
FIG. 5 is a graph that shows the UV-vis absorption of a doped polyaniline (PANI) (emeraldine salt) film deposited on a PPy/ITO film.
Figure 6:
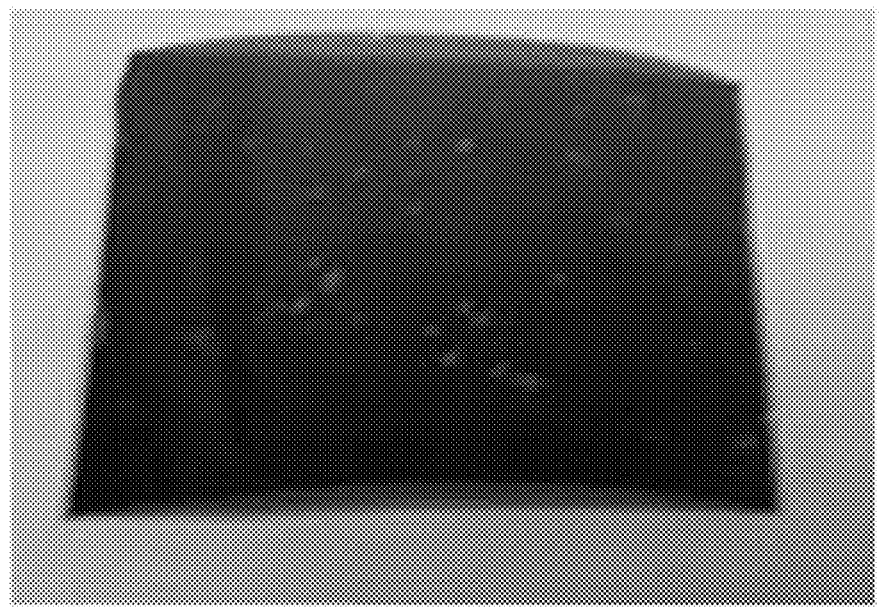
FIG. 6 is a photograph of a flexible PANI thin film separated with adhesive tape.
Figure 7A:
FIG. 7A is a photograph of a flexible aluminum substrate.
Figure 7B:
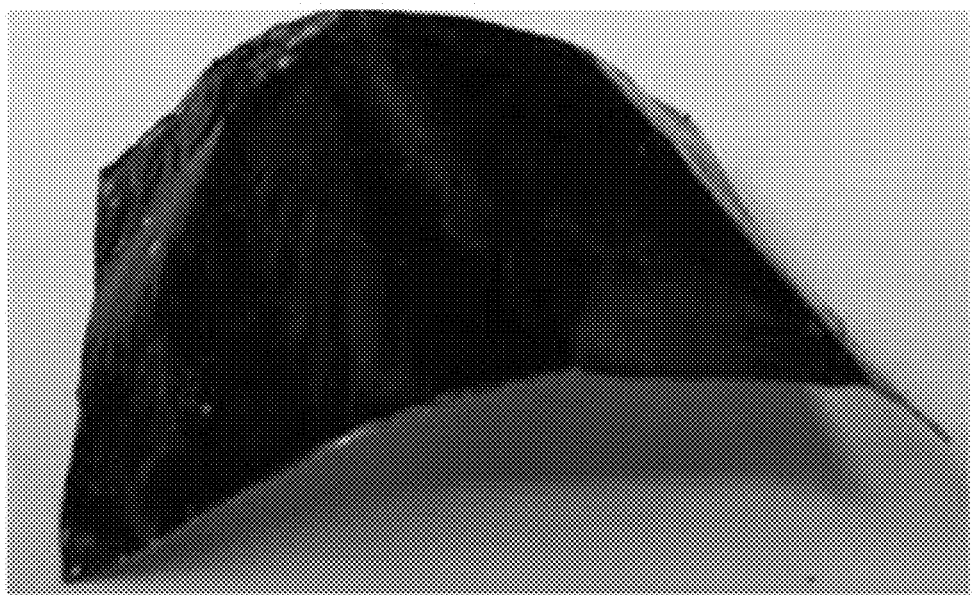
FIG. 7B is a photograph of a PANI thin film transferred to the aluminum substrate of FIG. 7A.

In another experiment, a solution of 0.2 M aniline and 1 M hydrochloric acid (HCl) was used to deposit a PANI film on a PPy/ITO substrate. The PANI film was deposited in an electrochemical cell comprising PPy/ITO-coated glass as the working electrode and a steel plate as the counter electrode at a potential of 1.2 V. The deposited PANI film was washed with water and kept dry using nitrogen gas or simply by blowing air over it. Once it was apparent that there was no visible water on the film, the film was covered with transparent adhesive tape. The upper surface of the tape was gently rubbed to remove air trapped between the film and the tape. Attempts were also made to remove the air using a vacuum pump while the sample was sitting in a vacuum oven. The PANI film was then completely removed from the surface by peeling the tape off the substrate. FIGS. 4A and 4B show thin and thick PANI films, respectively, that were deposited on PPy/ITO glass substrates for 7 and 30 minutes, respectively. FIG. 5 shows the characteristic UV-vis bands of PANI (emeraldine salt) film deposited over 30 seconds on the PPy film. The characteristic bands at 380 ($\pi$-$\pi$*), 460 (polaron), and 880 (doping) nm are clearly distinguishable in the UV-vis studies. FIG. 6 shows the PANI film on the transparent adhesive tape after the film was removed from the substrate on which it was deposited. FIG. 7A shows a flexible aluminum substrate and FIG. 7B shows a uniform thin film transferred onto the flexible aluminum substrate using the disclosed methods.

Figure 8:
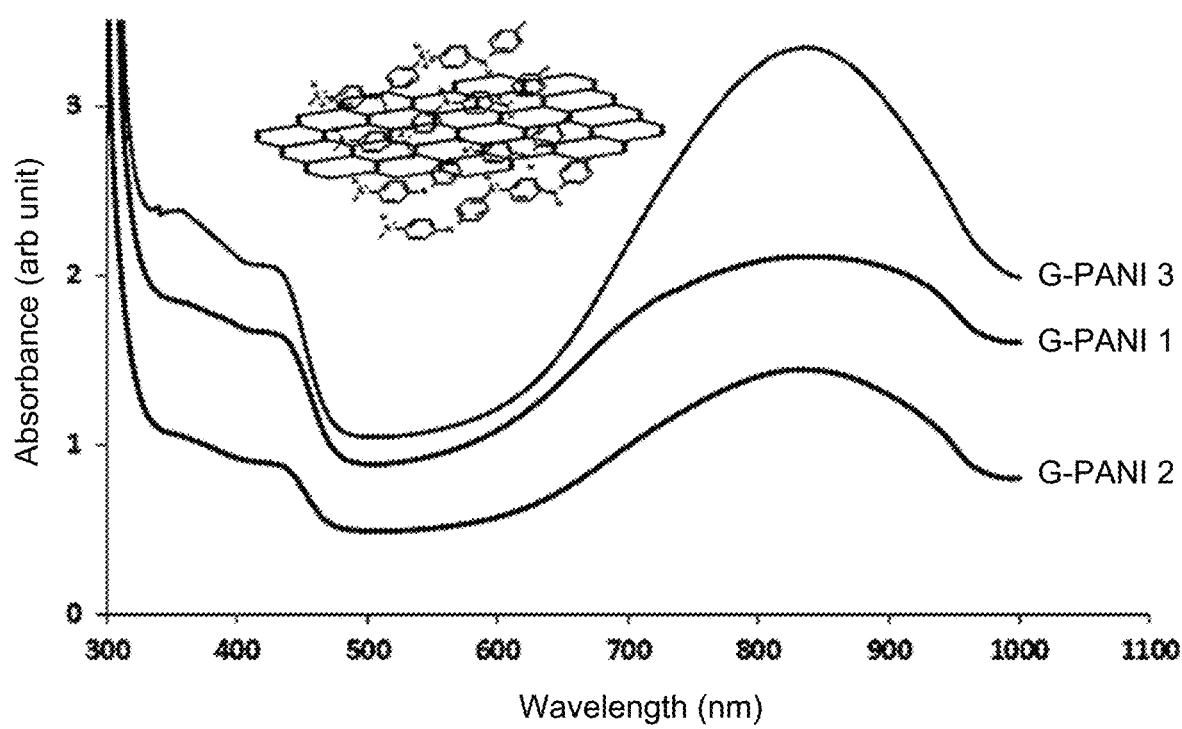
FIG. 8 is a graph that shows the UV-vis absorption of graphene (G)-PANI over a PPy/ITO substrate deposited as a function of time.

In further experiments, 0.2 M aniline and 10% weight of graphene-to-aniline monomer in a 1 HCl solution was separately prepared to deposit a G-PANI film on a PPy/ITO-coated glass plate. A potential (1200 mV) was applied in an electrochemical cell containing PPy/ITO-coated glass as working electrode and stainless steel as counter electrode. The film was deposited for 5 to 30 minutes. The G-PANI films were washed in water to remove any deposited particles. The film was dried by blowing air or nitrogen gas over the film and was then transferred using the transparent adhesive tape. FIG. 8 shows the UV-vis absorption spectra of a G-PANI film. The UV-vis spectra are different than those observed for the PANI film, showing the absorption for the dopant (700-966 nm) with peaks at 825 and 919 nm. However, the film was found to be highly conducting with a sheet resistance of only 4 to 6 ohms.

Figure 9:
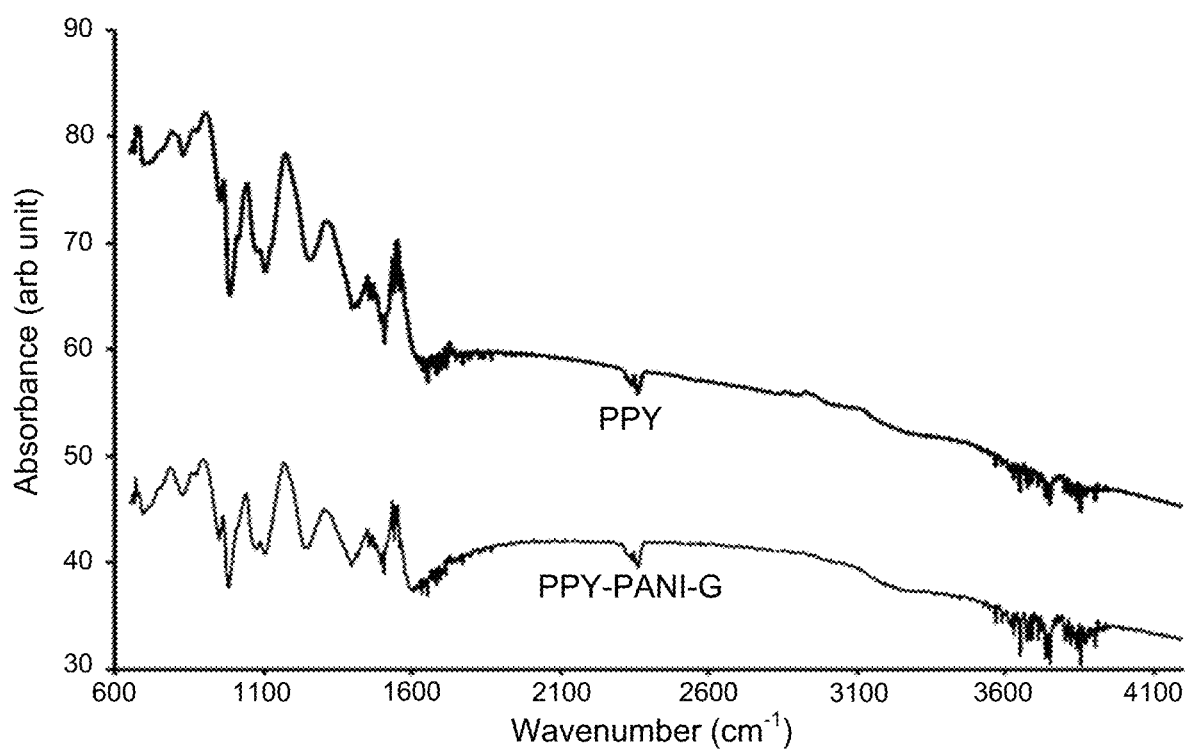
FIG. 9 is a graph that shows Fourier transform infrared spectroscopy (FTIR) spectra of PPy and PPy-PANI-G films from 600 to 4200 $cm^{-1}$.

FIG. 9 shows the Fourier transform infrared spectroscopy (FTIR) spectra of PPy and PPy-PANI-G films. The PPy (dark color) shows the bands at 3200, 1638, 1540, 1505, 1475, 1456, 1397, 1242, 1125, 1103, 1076, 1013, 983, 983, 954, 878, 827, and 692 $cm^{-1}$. The band at 1540 $cm^{-1}$ is due to stretching of the C=C vibration and the bands at 1475, 1456, and 1397 cm$^{-1}$ are due to the C—C and C—N vibration due to the pyrrole ring. The band at 1397 cm$^{-1}$ is due to dopant of PTS ion in PPy conducting polymer. The emeraldine salt has peaks at 3400, 2900, 1616, and 1191 cm$^{-1}$. The peak at 824 cm$^{-1}$ is due to C—H stretching for the emeraldine salt. The FTIR study of the graphene shows the characteristics peaks at 1720 cm$^{-1}$. The band at 1067 cm$^{-1}$ is due to the presence of carbonyl groups while deposited in an aqueous medium without removal of oxygen.

Figures 10A, 10B, 10C:
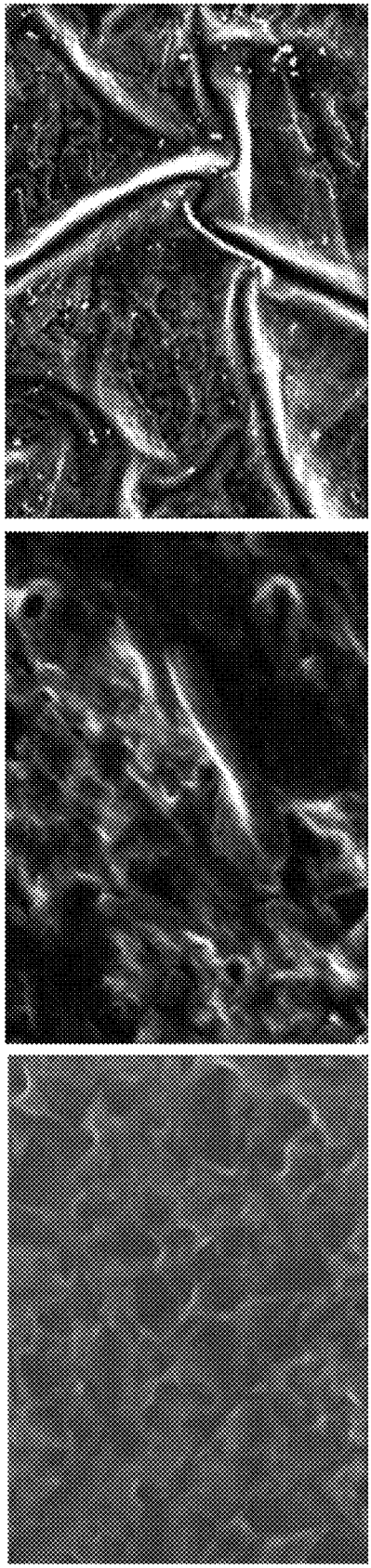
FIGS. 10A-10C are scanning electron microscope (SEM) images of PPy, PPy-G, and PPy-PANI-G self-supporting films, respectively.
Figures 11A, 11B:
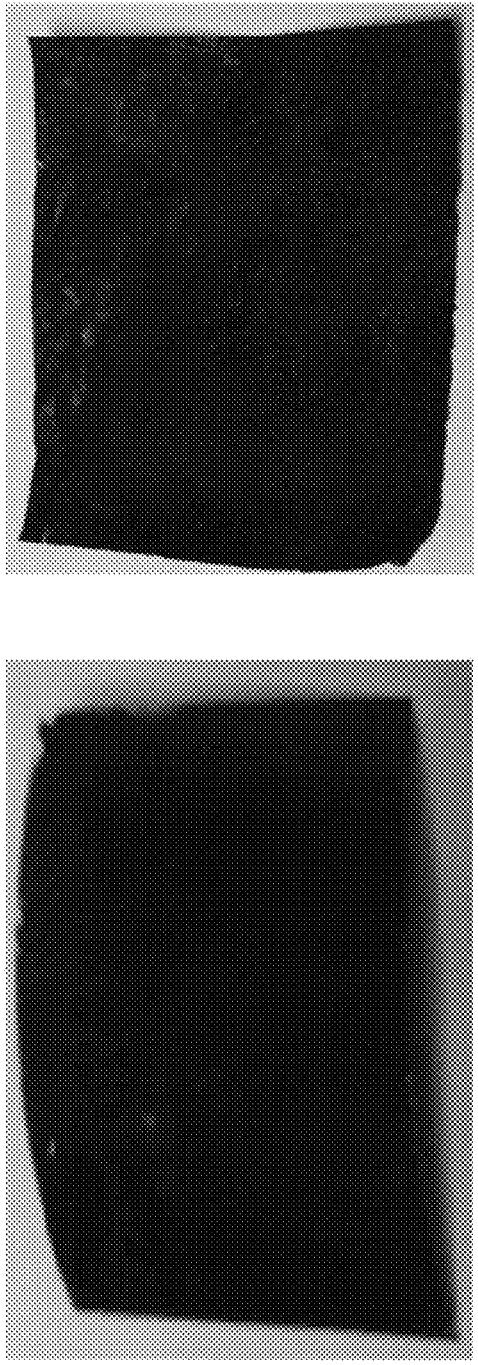
FIG. 11A is a photograph of a G-PANI film on a plastic substrate.
FIG. 11B is a photograph of a self-standing G-PANI on a PPy film.
Figure 12B:
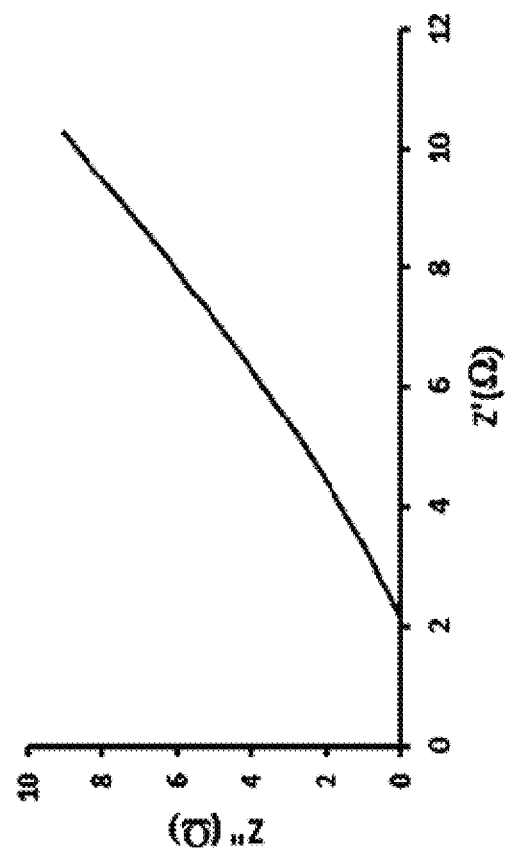
FIGS. 12A-12D are graphs that show (A) cyclic voltammograms, (B) a Nyquist plot, (C) a Bode plot, and (D) phase angle versus log frequency for the supercapacitor fabricated for G-PANI electrodes in 2M HCl.
Figure 12A:
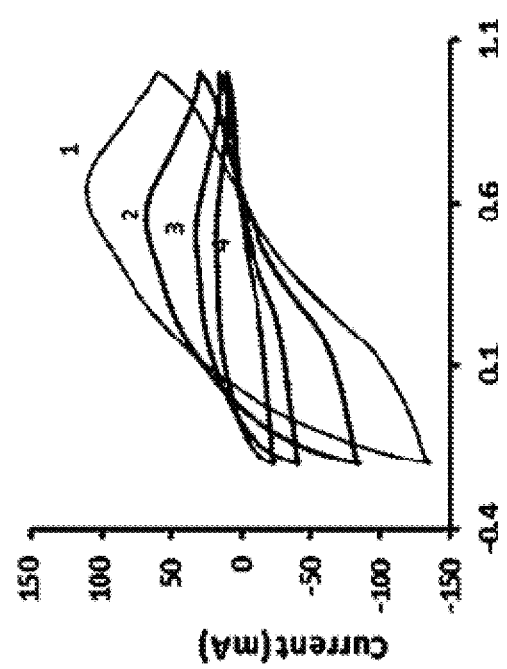
Figure 12D:
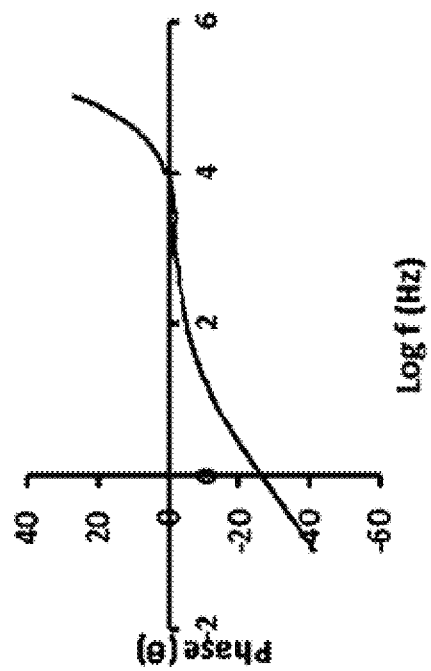
Figure 12C:
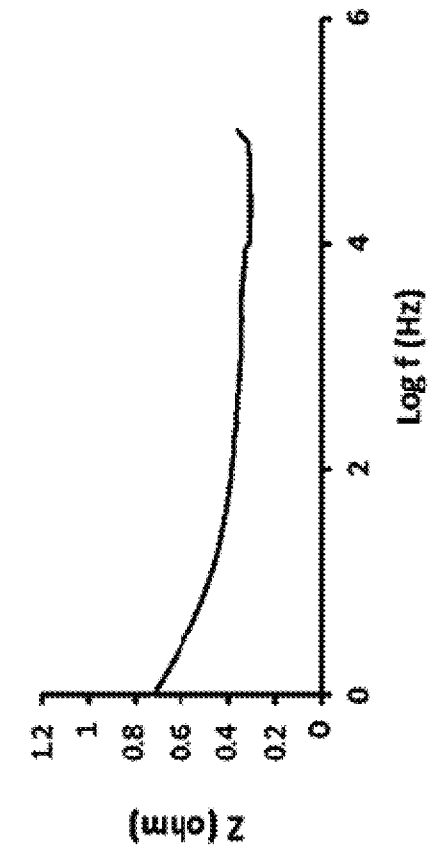

FIGS. 10A-10C show scanning electron microscope (SEM) images of PPy, PPy-G, and G-PPy-PANI-G films, respectively. The SEM image of the PPy films shows the typical flower/petal structure of PPy film. The presence of graphene creates a change in the structure as is apparent in the G PPy image, whereas the PPy-PANI-G image shows an interpenetrating network. FIG. 11A shows the G-PANI film on plastic and FIG. 11B shows the self-standing G-PANI on the PPy film.

A flexible G-PANI film deposited on a copper substrate was used to fabricate a supercapacitor using 2M HCl as electrolyte. Interestingly, the specific capacitance was calculated to be approximately 300 F/g for the G-PANI film using HCl as the electrolyte, which is consistent with the inventors' earlier work on G-PANI films. FIGS. 12A-12D respectively show the cyclic voltammograms, a Nyquist plot, a Bode plot, and a phase angle versus log frequency for the supercapacitor fabricated for G-PANI electrodes in 2M HCl. The resistance of the nanocomposite and electrolyte was measured to be 2 ohms using the Nyquist plot in FIG. 12B.

As can be appreciated from the foregoing discussion, conducting thin and thick PANI films were fabricated using the disclosed methodologies. The G-PANI film was used to fabricate a supercapacitor, resulting in a flexible capacitor with a specific capacitance of 300 F/gm. The disclosed methods can be used to fabricate free-standing, highly conducting polymer (PANI, PTh, PEDOT, etc.) and polymer composited (PANI-G, polythiophene-carbon nanotube, polyethylenedioxythiophene G, PANI-tin oxide $SnO_2$, PANI-$WO_3$, PANI-Fe2O3, etc.) films for various applications (supercapacitors, photovoltaics, microelectronics, sensors, memory devices, actuator, printed circuit board, electrochromic, touchchromic, photovoltaic, dye synthesized solar cell, etc.).

The invention claimed is:

1. A method comprising:
    electrochemically depositing a base layer of polypyrrole (PPy) on a conductive substrate, the polypyrrole forming only a weak bond with the conductive substrate;
    electrochemically depositing on the base layer a top layer of a conducting polymer selected from the group consisting of polythiophene (PTh), polyethylenedioxythiophene (PEDOT), polyhexylthiophene (PHTh), conducting methyl substituted polyaniline, ethyl substituted polyaniline, methoxy substituted polyaniline, conducting polymer copolymer, and mixtures thereof;
    applying adhesive tape to the top layer;
    peeling the tape off of the substrate, removing the top layer along with the tape, and leaving the base layer in place on the conductive substrate;
    applying the top layer to a different substrate; and
    dissolving the tape, leaving the top layer in place on the different substrate.

2. The method of claim 1, wherein the base layer has a thickness of approximately 1 to 100 nanometers.

3. The method of claim 1, wherein the conducting polymer of the top layer is a conducting polymer nanocomposite containing one or more of graphene (G), carbon nanotubes, tin oxide ($SnO_2$), iron oxide ($Fe_2O_3$), titanium oxide ($TiO_2$), tungsten oxide ($WO_3$), and nanodiamond.

4. The method of claim 1, wherein electrochemically depositing the top layer comprises electrochemically depositing multiple conducting polymer sublayers that together form the top layer, each sublayer comprising a different conducting polymer.

5. The method of claim 1, wherein the top layer has a thickness of approximately 2 to 2000 nanometers.

6. The method of claim 1, wherein applying adhesive tape comprises applying transparent adhesive tape to the top layer.

7. The method of claim 1, wherein electrochemically depositing the base layer comprises electrochemically depositing the base layer on the conductive substrate, the conductive substrate comprising a non-conductive material that is coated with a conductive material.

8. The method of claim 7, wherein the non-conductive material of the conductive substrate comprises a glass or polymeric material, and the conductive material coating the non-conductive material is indium tin oxide (ITO).

9. The method of claim 1, wherein applying adhesive tape to the top layer comprises rubbing the adhesive tape to remove air bubbles that exist between the adhesive tape and the top layer.

10. The method of claim 9, wherein rubbing the adhesive tape is performed while maintaining the top layer in a vacuum.

* * * * *